United States Patent
Narayan et al.

(10) Patent No.: US 7,255,496 B2
(45) Date of Patent: *Aug. 14, 2007

(54) PACKAGE FOR HOUSING AN OPTOELECTRONIC ASSEMBLY

(75) Inventors: Raghuram Narayan, Fremont, CA (US); Tieyu Zheng, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 11 days.

This patent is subject to a terminal disclaimer.

(21) Appl. No.: 11/039,174

(22) Filed: Jan. 19, 2005

(65) Prior Publication Data

US 2005/0141828 A1 Jun. 30, 2005

Related U.S. Application Data

(63) Continuation of application No. 10/444,342, filed on May 23, 2003, now Pat. No. 6,860,652.

(51) Int. Cl.
*G02B 6/36* (2006.01)

(52) U.S. Cl. .......................................... 385/92; 385/94

(58) Field of Classification Search ............ 385/88–95, 385/1, 3–5, 147, 14, 31; 438/106, 112, 116, 438/118, 119, 121, 122–128
See application file for complete search history.

(56) References Cited

U.S. PATENT DOCUMENTS

| | | | |
|---|---|---|---|
| 3,602,634 A * | 8/1971 | Meuli | ..................... 174/539 |
| RE29,325 E | 7/1977 | Hargis | |
| 4,712,030 A | 12/1987 | Lakin et al. | |
| 4,780,795 A | 10/1988 | Meinel | |
| 4,922,324 A * | 5/1990 | Sudo | ..................... 257/700 |
| 4,953,006 A | 8/1990 | Kovats | |
| 5,227,646 A | 7/1993 | Shigeno | |
| 5,337,396 A | 8/1994 | Chen et al. | |
| 5,378,924 A | 1/1995 | Liang | |
| 5,537,504 A | 7/1996 | Cina et al. | |
| 5,736,783 A | 4/1998 | Wein et al. | |
| 6,156,992 A | 12/2000 | Besslein | |
| 6,166,461 A | 12/2000 | Kusase et al. | |
| 6,172,412 B1 | 1/2001 | Wein et al. | |

(Continued)

OTHER PUBLICATIONS

Tatum, pp. 21-23, "VCSEL Packaging for Data Communication Transceiver Design," Fiberoptic Product News, Jun. 2000.

(Continued)

*Primary Examiner*—Hemang Sanghavi
(74) *Attorney, Agent, or Firm*—Marshall, Gerstein & Borun LLP

(57) ABSTRACT

A package for housing an optoelectronic device and an integrated circuit is disclosed. The package includes an insulating base having an upper surface. The optoelectronic device and the integrated circuit are mounted to the upper surface of the insulating base. The package also includes a metal sealing member having a top wall and a bottom wall. The bottom wall of the metal sealing member is attached to the upper surface of the insulating base. The package further includes a metal cover having a rim located at a bottom portion thereof. The rim of the metal cover is adapted to attach to the top wall of the metal sealing member to thereby hermetically seal the metal cover to the insulating base.

21 Claims, 3 Drawing Sheets

U.S. PATENT DOCUMENTS

| | | |
|---|---|---|
| 6,186,674 B1 | 2/2001 | Basavanhally |
| 6,203,212 B1 | 3/2001 | Rosenberg et al. |
| 6,227,724 B1 | 5/2001 | Verdiell |
| 6,252,762 B1 | 6/2001 | Amatucci |
| 6,252,773 B1 | 6/2001 | Werner |
| 6,303,893 B1 | 10/2001 | Perks |
| 6,328,484 B1 | 12/2001 | Uebbing |
| 6,331,992 B1 | 12/2001 | Gilliland et al. |
| 6,354,747 B1 | 3/2002 | Irie et al. |
| 6,376,268 B1 | 4/2002 | Verdiell |
| 6,388,264 B1 | 5/2002 | Pace |
| 6,400,566 B1 | 6/2002 | Ootori |
| 6,407,357 B1 | 6/2002 | Bellino et al. |
| 6,422,766 B1 | 7/2002 | Althaus et al. |
| 6,426,591 B1 | 7/2002 | Yanagisawa et al. |
| 6,444,297 B1 | 9/2002 | Bischel |
| 6,446,873 B1 | 9/2002 | Geryk |
| 6,450,699 B1 | 9/2002 | Murali et al. |
| 6,459,842 B1 | 10/2002 | Arsenault et al. |
| 6,493,861 B1 | 12/2002 | Li et al. |
| 6,495,895 B1 | 12/2002 | Peterson et al. |
| 6,501,652 B2 | 12/2002 | Katsui |
| 6,506,998 B2 | 1/2003 | VanOtteren et al. |
| 6,511,236 B1 | 1/2003 | Webjorn et al. |
| 6,512,861 B2 | 1/2003 | Chakravorty et al. |
| 6,515,251 B1 | 2/2003 | Wind |
| 6,585,424 B2 * | 7/2003 | Chason et al. ............... 385/88 |
| 6,588,949 B1 * | 7/2003 | Zhou ........................... 385/94 |
| 6,597,944 B1 * | 7/2003 | Hadas ......................... 600/546 |
| 6,723,379 B2 * | 4/2004 | Stark .......................... 427/180 |
| 6,739,764 B2 * | 5/2004 | Ido et al. ..................... 385/92 |
| 6,860,652 B2 | 3/2005 | Narayan et al. |
| 6,953,291 B2 * | 10/2005 | Liu ............................. 385/94 |
| 2002/0043551 A1 | 4/2002 | Payer et al. |
| 2003/0223709 A1 | 12/2003 | Lake et al. |
| 2003/0231671 A1 | 12/2003 | Huang et al. |
| 2004/0010910 A1 | 1/2004 | Farrell et al. |
| 2004/0012083 A1 | 1/2004 | Farrell et al. |
| 2004/0146253 A1 * | 7/2004 | Wang et al. ................. 385/93 |
| 2004/0150072 A1 | 8/2004 | Schnitt et al. |
| 2005/0094949 A1 * | 5/2005 | Mink ........................... 385/92 |
| 2005/0163439 A1 * | 7/2005 | Vanniasinkam et al. ...... 385/93 |

OTHER PUBLICATIONS

Selected pages of Kyocera online catalog, available at http://www.kyocera.co.jp/frame/products/semicon/oe_pkg/btf_pkg.html on Nov. 6, 2001.

Kayner, "Tolerance considerations for 10 Gbit/s pluggable module EMI solutions and electrical connector engagement," PicoLight, Aug. 1, 2002.

Kayner et al., "Designing a 10 Gbit/s small form factor pluggable transceiver module for PCI applications," PicoLight, Aug. 9, 2002.

Z.F. Shi et al., "Heat Sink Design Optimization for Optical Transponders," The 35th International Symposium on Microelectronics, Denver, Colorado, Sep. 4-6, 2002.

* cited by examiner

PACKAGE FOR HOUSING AN OPTOELECTRONIC ASSEMBLY

This is a continuation of U.S. Ser. No. 10/444,342, filed May 23, 2003 now U.S. Pat. No. 6,860,652, the entire disclosure of which is incorporated herein by reference.

FIELD OF THE DISCLOSURE

An optoelectronic assembly and, more specifically, a package adapted to house an optoelectronic assembly are disclosed.

BACKGROUND

Optoelectronic components or active optical devices such as diode lasers, light-emitting diodes (LEDs), and photodiode detectors are used for printing, data storage, optical data transmission and reception, laser pumps, and a multitude of other applications. Most optoelectronic components are typically sealed inside a hermetically sealed package for performance requirements and operational stability. Optoelectronic packages are intended to provide a hermetic structure to protect passive and active optical elements and devices as well as related electrical components from damage resulting from moisture, dirt, heat, radiation, and/or other sources.

For high-speed applications (e.g., 2 Gbps and above), proper operation of the optical and/or electrical components inside the package may be affected unless careful attention is paid to the packaging of these components. Standard optical module packaging such as that used in optical telecommunication applications requires a hermetic enclosure. Sealed packages are necessary to contain, protect, and electrically connect optoelectronic components. These requirements have resulted in packages that are large, costly, and more difficult to manufacture than typical electronic packages. In fact, the cost of most optoelectronic devices is mainly dominated by the package rather than the optical devices themselves.

Current designs of optoelectronic packages and associated fabrication processes are not easily adapted for automated manufacturing techniques because conventional packages for optoelectronic components such as large so-called "butterfly" packages are characterized by numerous mechanical parts (submounts, brackets, ferrules, etc.), and three-dimensional (3D) alignment requirements. Butterfly packages are basically can-and-cover type arrangements that contain an optical subassembly mounted to a metallic baseplate, with leads coming out of the sides for electrical connections. The optical subassembly may be built up separately, outside of the can, and then later installed in the can. The circuits within the optical subassembly are wire-bonded to the leads of the butterfly can, which is then sealed with a lid to create a hermetic enclosure. Unfortunately, conventional butterfly cans are bulky, costly, and time-consuming to manufacture. In addition, the electrical components require a separate electrical subassembly that is located outside of the butterfly can. The requirement of a separate electrical subassembly that is separate and apart from the optical subassembly inside the butterfly can increases manufacturing costs significantly.

Transistor-Outline (TO) packages are also commonly used to house optoelectronic components. Conventional TO packages include a generally cylindrical metal cap and a metal header or base, to which the metal cap is attached. In such packages, metal-based bonding techniques such as, for example, brazing or fusion welding, are often required to provide a hermetic seal between the metal cap and the header. To weld the metal cap onto the header, the header is typically formed of a metallic material such as Kovar™ or stainless steel. However, it is advantageous to use ceramic bases in connection with high-speed applications because ceramic bases are ideal for RF applications. Particularly, ceramic headers provide easy routing of high-speed circuits. Unfortunately, ceramic is not compatible with metal with regard to weldability, and therefore has not been widely used as the material for the header or base in conventional TO packages.

In addition, when active optical devices (e.g., diode lasers) and integrated circuits adapted to control the active optical devices (e.g., diode drivers) are spaced too far apart from each other, parasitic capacitance, resistance, and/or inductance may affect electrical signals traveling between the components, thus resulting in degradation of the electrical signal. The electrical performance is of particular concern for high-speed applications. Consequently, electrical performance may be improved during high-speed applications when the distance between the active optical device and its associated driving or receiving integrated circuit chip is as short as possible. Although this arrangement improves the electrical signal integrity, it increases heat dissipation requirements of the assembly significantly.

As the power density increases in optoelectronic devices and/or electrical components used in high-speed applications, a suitable, optimal heat sink is necessary to dissipate heat efficiently from the optoelectronic device and/or electrical components. Heat sinks are devices capable of dissipating heat away from the optoelectronic and/or electrical components into the surrounding atmosphere by convection. Typical heat sinks include cooling fins attached to a heat sink base that is in contact with the header or base of the optoelectronic package. The fins of the heat sink may have any shape and size necessary to spread heat away from the optoelectronic device and/or electrical components, and may be oriented either parallel or perpendicular relative to the base of the optoelectronic package.

Commercially available heat sinks are generally square or rectangular in shape. As such, the circular headers of conventional optoelectronic packages require either modifications to the structural design of the heat sinks to be able to accommodate the circular headers, or manufacturing adjustments to attach the circular header to the square or rectangular heat sink. This configuration results in a complex, slow, and expensive manufacturing process. Additionally, the quality of the contact between the optoelectronic package and the attached heat sink has a great impact on the overall thermal performance. Lower thermal impedance between the optoelectronic package and the heat sink results in higher conductive heat transfer. Therefore, it is advantageous that the header of the optoelectronic package be in intimate, conformal contact with the attached heat sink to optimize the thermal characteristics, which results in increased efficiency.

Moreover, existing optoelectronic packaging techniques often involve manual or semi-automated manufacturing processes. Therefore, to reduce manufacturing costs, it is advantageous to employ automated batch packaging processes that can fabricate a large number of optoelectronic packages simultaneously.

Therefore, there is a need for an improved optoelectronic package and a process for making the optoelectronic package that can address some or all of the problems described above.

DESCRIPTION OF THE PRESENTLY PREFERRED EMBODIMENTS

Figure 1:
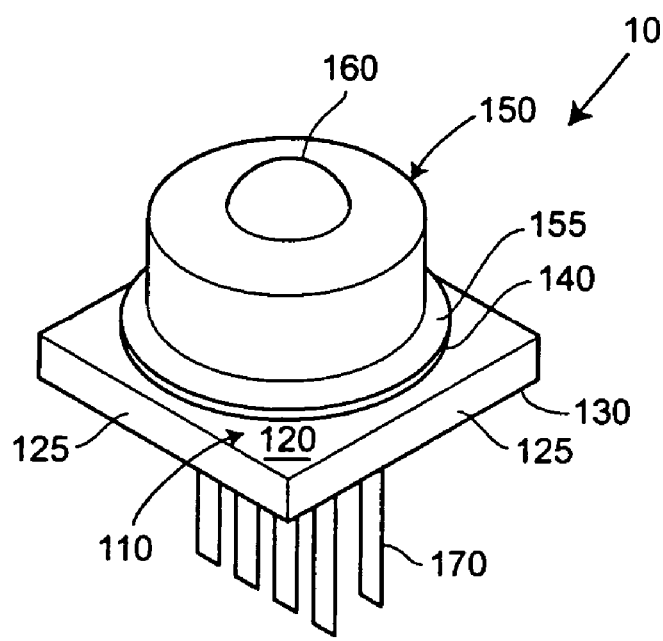
FIG. 1 is a perspective view of a package for housing an optoelectronic assembly in accordance with the teachings of the present disclosure.

Referring to FIG. 1, a package 100 for housing an optoelectronic assembly is shown. The package 100 includes an insulating base or substrate 110, a metal sealing member 140, and a metal cover 150. Preferably, the insulating base 110 is formed of a material with good thermal conductivity for directing dissipated heat away from the optoelectronic assembly. By using a high thermal conductivity material, the insulating base 110 is capable of effectively dissipating the heat of uncooled active optical devices, e.g., diode lasers, and can incorporate integrated circuits, e.g., diode driver chips, into the optoelectronic package 100. In the past, these integrated circuit chips have not been integrated into the optoelectronic package 100 because the thermal conductivity of the metallic header of conventional optoelectronic packages was unsuitable for mounting such chips. As discussed in greater detail below, the integrated optoelectronic package 100 of the present disclosure, which includes the active optical device 200 and its associated integrated circuit 220 (see FIGS. 4a and 4b) provides a high-speed module that saves power, space, and costs without sacrificing reliability and performance.

Suitable materials for the insulating base 110 include ceramics such as alumina, beryllium oxide (BeO), and aluminum nitride (AlN). The insulating base 110 includes an upper surface 120, a lower surface 130, and four substantially flat sidewalls 125 (only two of which are shown) extending downwardly from the upper surface 120. The thickness of the insulating base 110 may be approximately 1 mm. Of course, it should be understood that the insulating base 110 could be thicker or thinner as desired.

As shown, both the upper and lower surfaces 120, 130 of the insulating base 110 are substantially planar. It is well-known that mounting techniques using planar substrates such as, for example, pick-and-place techniques are well-suited to high-volume manufacturing. In addition, because overall mechanical stability is directly related to the stability of the base 110, the substantially planar upper surface 120 of the optoelectronic package 100 provides good mechanical stability. Furthermore, by using low thermal expansion materials such as ceramics for the base 110, optimal mechanical stability may be obtained.

Due to the polygonal shape (e.g., square or rectangular) of the insulating base 110, the contact at the mating, heat-conducting surface of the insulating base 110 and a commercially available square or rectangular-shaped heat dissipating device (not shown) is improved. Preferably, the heat dissipating device is a heat sink. However, other types of heat dissipating devices such as, for example, heat pipes are equally applicable. In this manner, the polygonal shape of the insulating base 110 provides sufficient thermal contact and coupling with a polygonal-shaped (e.g., square or rectangular) heat sink, thereby improving the heat transfer characteristics therebetween. In addition, the substantially flat sidewalls 125 provide a greater heat dissipation area because the heat generated by the optoelectronic and/or electrical components housed within the package 100 may be conducted to the substantially flat sidewalls 125. As a result, heat dissipation efficiency is increased. Furthermore, the high thermal conductivity of the ceramic material of the insulating base 110 makes it possible to efficiently extract the heat produced by the optoelectronic device and/or electrical components.

Figure 2:
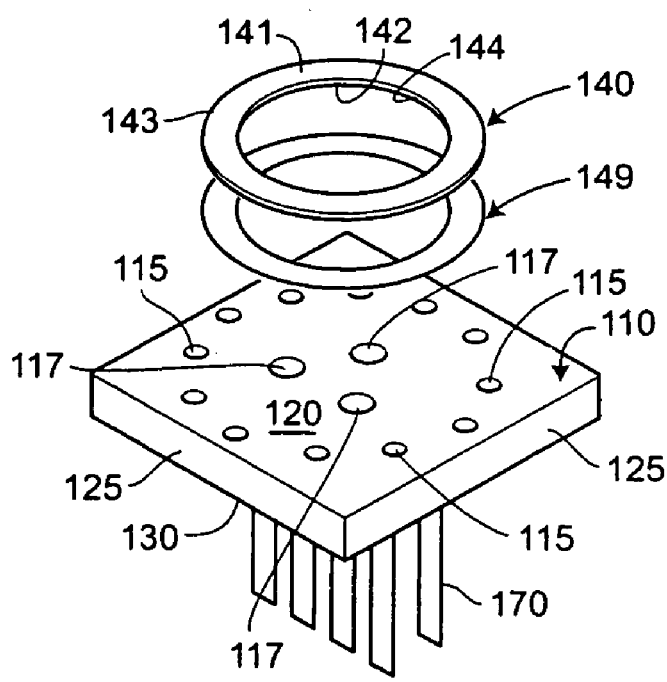
FIG. 2 is an exploded view of the insulating base having a plurality of holes that are filled with a conductive material formed therein, a metal sealing member adapted to be secured to the insulating base, and an adhesive layer located between the metal sealing member and the insulating base.

With reference to FIG. 2, a first plurality of holes or vias 115 is formed through the insulating base 110 by, for example, a mechanical drilling process or a laser machining process. Preferably, the diameter of each hole 115 is half the thickness of the insulating base 110. Of course, the diameter could be larger or smaller than this diameter as desired. In addition, the spacing between two holes 115 is approximately twice the diameter of the holes 115. The holes 115 are adapted to conduct welding current from the metal cover 150 to the insulating base 110 during a welding operation to hermetically seal the metal cover 150 to the insulating base 110. As shown, each of the plurality of holes 115 is generally circular in shape, and is formed into a generally circular configuration. However, the holes 115 may have other shapes as well. For example, the holes 115 may be oval, square, rectangular, octagonal, etc. in shape. Likewise, the plurality of holes 115 may be formed into other geometric configurations such as, for example, ovals, squares, rectangles, etc. Lastly, although twelve holes 115 are shown, any desired number of holes 115 may be provided.

A second plurality of holes or vias 117 may be formed through the insulating base 110, and located within an inner region of the first plurality of holes 115. The second plurality of holes or signal vias 117 are adapted to electrically connect signals from the upper surface 120 of the insulating base 110 to the lower surface 130 of the insulating base 110.

The insulating base 110 also includes a conductive material layer (not shown) deposited on both the upper and lower surfaces 120, 130 of the insulating base 110. The material layers may be deposited using physical vapor deposition (PVD) techniques such as evaporation, sputtering, screen printing, or other suitable processes. The conductive material may include a metal such as, for example, copper, gold, tin, a copper/tin alloy, tungsten, lead, nickel, palladium, Kovar™, or any other similar metal. Preferably, the metal layers on each of the upper and lower surfaces 120, 130 of the insulating base 110 include a thick film metallization that is capable of being soldered or brazed. In other words, the metal layers include films with a thickness of greater than approximately 10 μm. If desired, however, the metal layers may include a thin film metallization. In any event, the thickness of the metal layers is based, in part, on the requirements for brazing or soldering of the metal sealing member 140 to the upper surface 120 of the insulating base 110.

The first plurality of holes 115 and the second plurality of holes 117 are, likewise, substantially filled with the same or similar electrically conductive material as that deposited on the upper and lower surfaces 120, 130 of the insulating base 110. For example, the first plurality of holes 115 and the second plurality of holes 117 may be filled with flowable solder, or screen-filled using a paste of conductive material such as, for example, copper and/or tungsten. A metal contact member (not shown) may be attached to the lower metallized surface 130 of the insulating base 110 via an adhesive layer (e.g., a brazing paste or a solder preform layer) disposed between the metal contact member and the lower surface 130 of the insulating base 110. The metal contact member is adapted to contact each of the first plurality of filled holes 115 at the lower surface 130 of the insulating base 110. The metal contact member may be sufficiently etched, grinded, and/or polished to provide a substantially flat contact surface at the lower surface 130 of the insulating base 110.

The insulating base 110 may be configured as a multilayer substrate having a plurality of levels. Multiple metal layers may be provided at each of the plurality of levels, and joined together (e.g., laminated) on the insulating base 110. In this configuration, the second plurality of holes 117 may be formed in the layers so that signals can be communicated between the adjacent layers.

The metal layers deposited on the upper and lower surfaces 120, 130 of the insulating base 110 may be patterned to include a plurality of electrically conductive paths or traces (not shown). The metallized pattern on the upper and lower surfaces 120, 130 and any of the intermediate layers of the insulating base 110 may be formed by photolithography, stamping, electroplating, etching, electro-discharge machining, or other similar techniques. The optical devices and/or electrical components may be mounted to and electrically connected to the conductive metallized pattern on the upper surface 120 of the insulating base 110.

At least one electrical lead 170 is attached, such as by brazing, to the lower metallized surface 130 of the insulating base 110, and is connected to the upper metallized surface 120 of the insulating base 110 via the second plurality of filled holes 117. The electrical leads 170 are adapted to communicate signals from the optoelectronic and/or electrical components housed inside the package 100 to components located external to the package 100 on a printed circuit board, for example. The leads 170 may be circular or rectangular in cross-section. Preferably, the electrical leads 170 are arranged as an array of leads 170, and may be located at any location on the lower surface 130 of the insulating base 110. The insulating base 110 may be operatively coupled to sockets in the printed circuit board (not shown) via the electrical leads 170. Alternatively, the insulating base 110 may be operatively coupled to the printed circuit board using solder connections such as, for example, ball grid array connections and/or a flex circuit.

Figure 3:
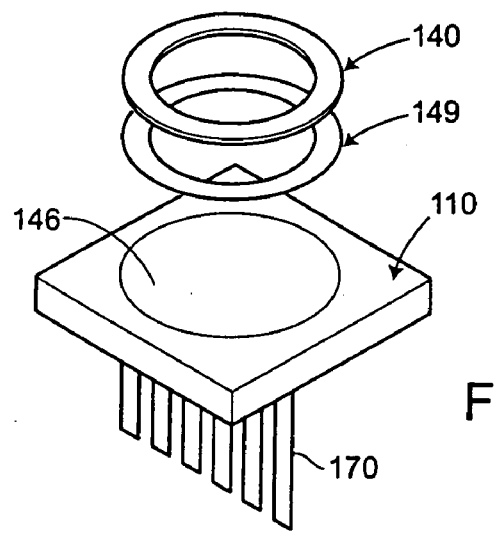
FIG. 3 is an exploded view of the insulating base with the plurality of filled holes covered by a metal layer, the adhesive layer, and the metal sealing member.

With reference to FIGS. 2 and 3, the metal sealing member 140 may be sealably attached to the upper metallized surface 120 of the insulating base 110 using an adhesive layer 149 disposed between the metal sealing member 140 and the upper surface 120 of the insulating base 110. As shown in FIG. 3, the metal layer on the upper surface 120 of the insulating base 110 may be etched, grinded, and/or polished to provide a substantially flat contact surface for attachment of the metal sealing member 140. The metal sealing member 140, which may be formed of Kovar™ or any other similar metallic material, includes a top wall 141, a bottom wall 142, an outer wall 143, and an inner wall 144. Preferably, the metal sealing member 140 is a sealing ring having a generally circular cross-sectional shape between the outer wall 143 and inner wall 144. However, the metal sealing member 140 may have other shapes as well. For example, the metal sealing member 140 may have a generally oval cross-sectional shape between the outer wall 143 and inner wall 144. Still further, the metal sealing member 140 may have a polygonal shape such as a rectangular cross-sectional shape or a square cross-sectional shape between the outer wall 143 and inner wall 144.

The adhesive layer 149, which is basically a wafer-sized prefabricated bond, is disposed on the upper surface 120 of the insulating base 110. The adhesive layer 149 may include a brazing paste of, e.g., copper and/or silver, or a solder preform layer 149 formed of metal (e.g., a gold or tin preform). The bottom wall 142 of the metal sealing member 140 is then positioned on the adhesive layer 149 on the upper surface 120 of the insulating base 110. Through appropriate use of a brazing heat operation, the metal sealing member 140 is bonded to the upper surface 120 of the insulating base 110.

Referring back to FIG. 1, a cover 150, preferably formed of Kovar™ or other suitable metal, is then hermetically sealed to the top wall 141 of the metal sealing member 140 to contain and fully enclose the optoelectronic and electrical components mounted to the upper surface 120 of the insulating base 110, and to thereby seal off the module package 100. Use of such a hermetically sealed cover 150 acts to keep out moisture, corrosion, and ambient air to therefore protect the generally delicate optoelectronic and electrical components housed inside the package 100.

Typically, the metal cover 150 is circular or cylindrical in shape. However, the metal cover 150 may have a square or rectangular shape instead. The metal cover 150 may include a lower peripheral edge or rim 155 having a shape that is generally complementary to the shape of the metal sealing member 140 so that the rim 155 of the metal cover 150 can be hermetically sealed to the top wall 141 of the metal sealing member 140. For example, the lower rim 155 of the metal cover 150 may be generally circular when the metal sealing member 140 has a generally circular cross-sectional shape between the outer wall 143 and inner wall 144. Likewise, the lower rim 155 of the metal cover 150 may be generally rectangular when the metal sealing member 140 has a generally rectangular cross-sectional shape between the outer wall 143 and inner wall 144. By enclosing and hermetically sealing the metal cover 150 to the insulating base 110, the optoelectronic and electrical components housed within the package 100 are kept in a controlled gaseous, liquid, or vacuum environment that protects them and prevents degradation in their performance and/or lifetime.

As shown in FIG. 1, the rim 155 of the metal cover 150 may be set back from the outer wall 143 of the metal sealing member 140. Alternatively, the rim 155 of the metal cover 150 may be substantially flush with the outer wall 143 of the metal sealing member 140. As discussed in more detail below, a hermetically sealed attachment of the metal cover 150 to the metal sealing member 140 on the insulating base 110 may be established by, for example, seam welding, laser welding, resistance welding, soldering, glazing, etc.

The metal cover 150 includes a transparent portion 160 such as, for example, a flat glass window, ball lens, aspherical lens, or GRIN lens. The optoelectronic components are mounted to the insulating base 110 within the package 100 in a manner such that light is able to pass to or from them through the transparent portion 160. Typically, the transparent portion 160 is formed of glass, ceramic, or plastic. To avoid effects on the optoelectronic and electrical components housed within the package 100, the transparent portion 160 of the cover 150 may be provided with an antireflection coating to reduce optical loss and back-reflection. The transparent portion 160 of the metal cover 150 is aligned with the beam emergence side of the optoelectronic device 200, so that the optoelectronic device 200 can be optically coupled to external components such as, for example, an optical fiber or any element that requires optical alignment with other optical devices, through the transparent portion 160.

Figures 4A, 4B:
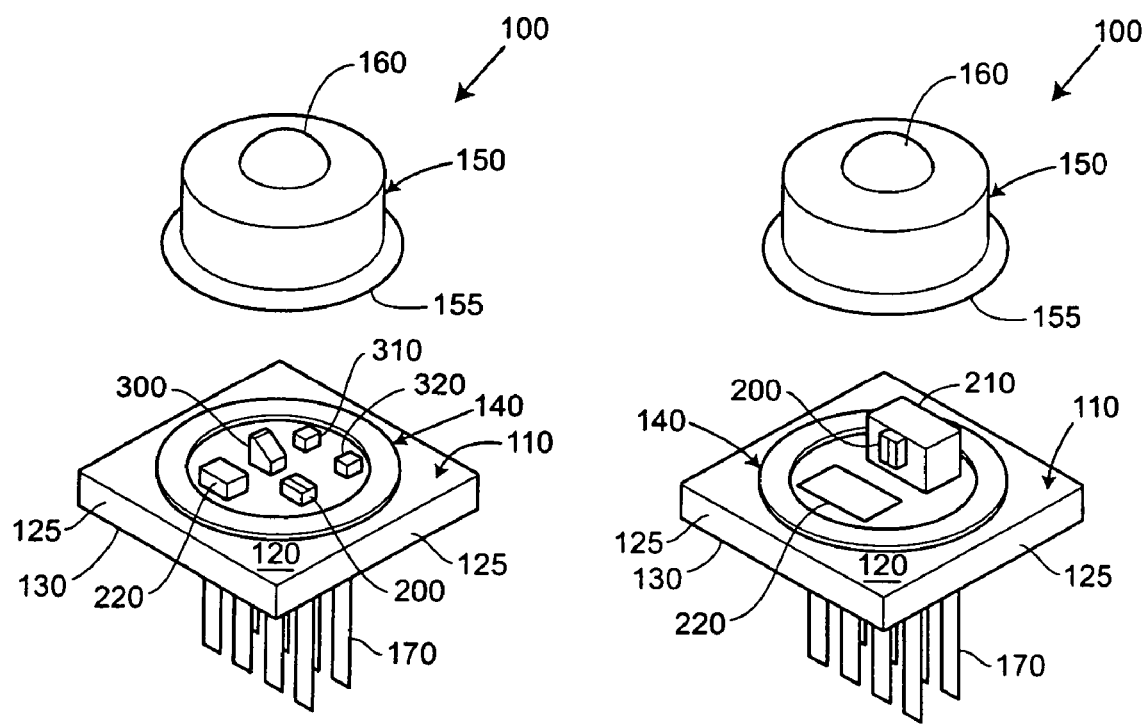
FIG. 4a is an exploded view illustrating the optoelectronic package populated with optoelectronic, optical, and electrical components in accordance with a first embodiment.
FIG. 4b is an exploded view illustrating the optoelectronic package populated with optoelectronic and electrical components in accordance with a second embodiment.

Referring to FIGS. 4a and 4b, the insulating base 110 may form the bottom of the package 100, thus making a completely self-contained package 100. Alternatively, the insulating base 110 may include one or more submounts 210 that carry the optoelectronic and/or electrical components. In other words, the optoelectronic and/or electrical components may be mounted directly to the upper surface 120 of the insulating base 110 (FIG. 4a), or may be mounted to submounts 210 that are attached to the insulating base 110 (FIG. 4b).

With particular reference to FIG. 4a, an active optical device 200 and its associated integrated circuit chip 220, a passive optical device 300, and various other electrical components 310, 320 are located within an inner region of the metal sealing member 140. As is well-known, these optical and/or electrical components may be mounted to the upper surface 120 of the insulating base 110 by pick-and-place techniques commonly used in the electronics industry, and attached to the insulating base 110 by adhesive bonding, soldering, welding, gluing, or other similar method. Because the insulating base 110 is substantially planar, the pick-and-place automation may use relatively simple machine vision for accurate placement and alignment of the various components.

As shown in FIG. 4a, the insulating base 110 serves as both a mounting surface for the various optical and/or electrical components as well as the bottom or header of the package 100 itself. As a result, a higher-performance and cost-effective enclosure may be realized. In particular, the package 100 may be assembled in a relatively uncomplicated manner by simply attaching the metal cover 150 to the base 110 upon which the optoelectronic components are mounted to thereby create a hermetic enclosure. Thus, the manufacturing process may be automated, and requires a minimum number of materials and manufacturing steps.

To ensure low parasitic effects (e.g., inductance, capacitance, and/or resistance) and reduced interconnect lengths for enhanced electrical performance, it is advantageous to mount the active optical device 200 and the integrated circuit 220 close to each other inside the package 100. As a result, higher performance may be achieved in smaller packages at low cost. This configuration is particularly advantageous for high-speed applications because extraneous wiring that may limit the high-speed operation of the optoelectronic package 100 is eliminated.

Optically active devices 200 include any well known or future devices that generate light when stimulated, that sense light, convert light to electrical signals, or that condition light. For example, active optical devices 200 may include light emitters (e.g., vertical cavity surface-emitting lasers (VCSEL), Fabry-Perot (F-P) lasers, distributed-feedback (DFB) lasers, light emitting or sensing diodes, and the like), light sensors (e.g., photodetectors), and optical modulators. The integrated circuit 220 is any chip suitable for applying an electrical signal to the active optical device 200 to activate and control the device 200 such as, for example, a microprocessor, a driver chip for a transmitter device, or a transimpedance amplifier chip for a receiver device. Implementation of the microprocessor, driver, or transimpedance amplifier integrated circuit 220 is well known, and thus will not be further described.

In addition to the active optical device 200 and its associated integrated circuit 220, other optical and/or electrical components such as a mirror 300, thermistor 310, capacitor 320, etc. may be mounted to the insulating base 110 and housed inside the package 100. It is to be understood, however, that other optical and/or electrical devices besides those mentioned above may be mounted to the insulating base 110 as well.

As shown in FIG. 4a, the path of rays of the active optical device 200, e.g., a diode laser, radiates in a direction that is parallel to the plane of the upper surface 120 of the insulating base 110. Because the laser light should pass through the transparent portion 160 located at the top of the metal cover 150, the active optical device 200 is not properly oriented for optical coupling through the transparent portion 160 of the metal cover 150. Instead, the path of rays should radiate in a perpendicular direction to the plane of the upper surface 120 of the insulating base 110 for optical coupling through the transparent portion 160. The required perpendicular mounting is achieved by providing a passive optical device, e.g., a mirror 300, located at the beam emergence side of the active optical device 200. The mirror 300 functions to deflect the light incident onto the mirror 300 so that the light from the diode laser 200 is able to pass through the transparent portion 160 of the metal cover 150. Although the electrical components 310, 320 are shown as being housed inside the optoelectronic package 100 in FIG. 4a, one or more of the electrical components 310, 320 may be located external to the optoelectronic package 100.

In a second embodiment shown in FIG. 4b, one or more submounts 210 may be mounted to the upper surface 120 of the insulating base 110. The submount 210 may be made of a high thermally conductive material such as, for example, copper tungsten, aluminum nitride, beryllium oxide, and boron nitride. The submount 210 may be mounted to the upper surface 120 of the insulating base 110 by, for example, soldering, brazing, gluing, etc., or may even be an integral, raised portion of the insulating base 110 itself. The submount 210 includes wraparound metal paths or traces, and conducting vias formed therein. The wraparound metal paths and conducting vias connect signals from components mounted to the submount 210 to components mounted to the insulating base 110. In addition, the submount 210 may be configured as a multilayer submount 210 having a plurality of levels laminated and electrically-connected together.

In this embodiment, the active optical device 200 is mounted to the submount 210 and oriented such that the path of rays radiates in a direction that is perpendicular to the plane of the upper surface 120 of the insulating base 110. The metal cover 150 is then attached to the insulating base 110 with the transparent portion 160 over the beam emergence side of the active optical device 200. Although only one optical device 200 is shown mounted to the submount 210 in FIG. 4b, it is to be understood that other optical and/or electrical components may be premounted to the submount 210 to form a subassembly. This subassembly may be incorporated with the integrated circuit 220 inside the optoelectronic package 100 to form a complete module.

Figure 5:
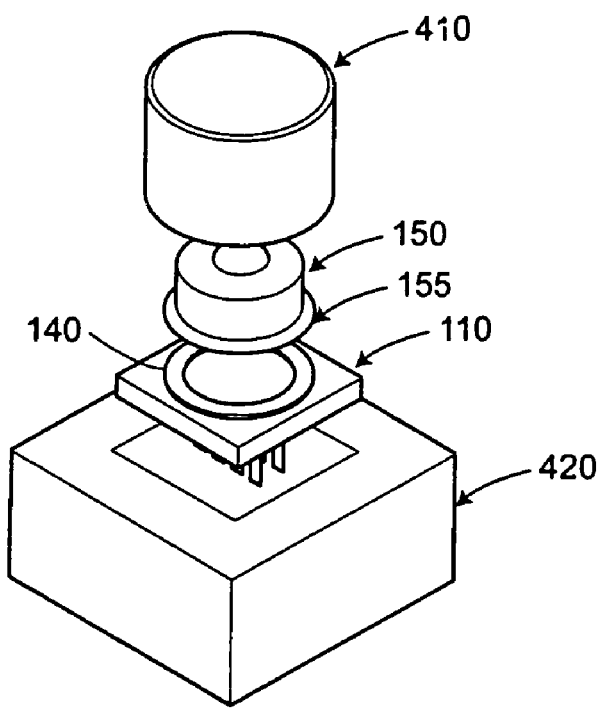
FIG. 5 is an exploded view illustrating an exemplary welding apparatus adapted to weld the metal cover to the metal sealing member attached to the insulating base.
Figures 6, 7:
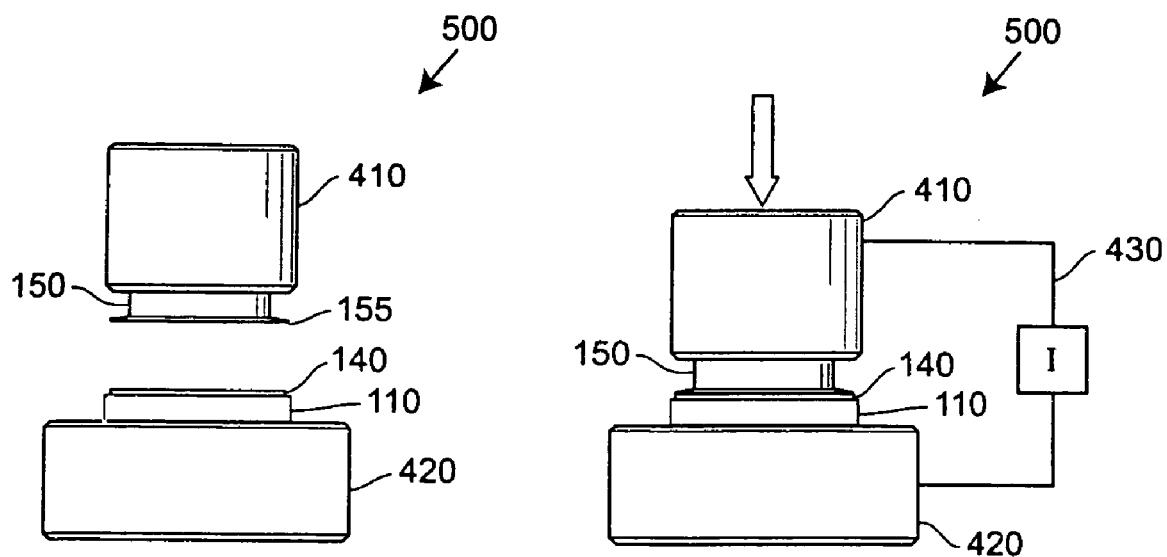
FIG. 6 is a front view illustrating the exemplary welding apparatus before the metal cover is welded to the metal sealing member attached to the insulating base.
FIG. 7 is a front view illustrating the exemplary welding apparatus during a welding operation to weld the metal cover to the metal sealing member attached to the insulating base.

With reference to FIGS. 5-7, a welding apparatus 500 adapted to weld the metal cover 150 to the metal sealing member 140 on the insulating base 110 to form the optoelectronic package 100 is disclosed. As shown in FIG. 5, the metal cover 150 is abutted against the top wall 141 of the metal sealing member 140. The lower peripheral rim 155 of the metal cover 150 is adapted to mate with the top wall 141 of the metal sealing member 140. A hermetic airtight seal is obtained by welding the lower rim 155 of the metal cover 150 to the top wall 141 of the metal sealing member 140.

During the welding process, the two metallic surfaces of the rim 155 of the metal cover 150 and the metal sealing member 140 are brought into contact with heat and pressure. This results in the sharing of atoms between the metallic components to form a mechanical bond. Resistance welding is a well-known welding technique for joining two metallic components. In its simplest form, resistance welding is the fusion of metals by controlled heat or current and, in some cases, pressure or force. During a resistance welding process, fusion of metals is produced by the heat obtained from resistance of the metallic components to electric current in a circuit or current path 430 of which the metallic components are a part, and by the application of pressure to the metallic components by electrodes. The current path 430 travels through the metallic components between a pair of opposed electrodes 410, 420. The advantages of resistance welding include its versatility, the speed and ability to automate the welding process, and the ability to make a number of welds simultaneously. Specifically, with one-shot projection resistance welding, the weld is completed in a single shot within milliseconds.

FIG. 6 illustrates an exemplary welding apparatus 500 adapted to weld the metal cover 150 to the metal sealing member 140 attached to the insulating base 110. At least two electrodes 410, 420 are provided to hold the metallic components together during the welding process. Specifically, during a resistance welding process, two metallic components (i.e., the metal cover 150 and the metal sealing member 140 attached to the insulating base 110) are compressed together between the upper and lower electrodes 410, 420 for a predetermined period of time. Either the first electrode 410 or the second electrode 420 may apply the necessary force to weld the metallic components together.

Upon reaching the desired force, a predetermined current is applied to the metal cover 150, the metal sealing member 140, and the first plurality of filled holes 115 formed in the insulating base 110 via the first and second electrodes 410, 420. As shown in FIG. 7, the first and second electrodes 410, 420 are adapted to supply the required current through the metal cover 150, the metal sealing member 140, and the first plurality of filled holes 115 formed in the insulating base 110 for a predetermined period of time to form a weld nugget to weld the metallic components together. The amplitude and time of the welding current may be controlled by a control system (not shown).

The resistance of the metal cover 150 and metal sealing member 140 attached to the insulating base 110 produces sufficient heat to create a fusion between the metals, i.e., until a liquid molten pool of material from the metals forms at an interface between the metal cover 150 and the metal sealing member 140 attached to the insulating base 110. A predetermined amount of force is applied to control the molten area and ensure proper union.

The first and second electrodes 410, 420 maintain the metal cover 150 in contact with the insulating base 110 during the welding operation as the weld nugget is formed. Particularly, after the current is applied to the metal cover 150, the metal sealing member 140, and the first plurality of filled holes 115 formed in the insulating base 110, the components are allowed to cool so that the liquid molten pool at the interface of the components solidifies to form the weld nugget.

The welding parameters, i.e., the force, current, time, etc., may depend on the thickness of the metallic components being welded together, the resistance of the current path 430, and the size of the desired weld nugget. Moreover, any device capable of providing a welding current may be used such as, for example, a control system, a capacitor discharge system, etc. Furthermore, although the metal cover 150 is welded to the insulating base 110 using projection resistance welding due to its ability to produce high-volume output, other welding techniques could be used such as, for example, seam welding, laser welding, and other types of hermetic welding. Still further, any of a variety of welding structures capable of providing movement of one or more electrodes to provide pressure to components may be utilized such as for example, a rocker arm welder, C-frame welder, press welder, automatic welder, robotic welder, etc.

The optoelectronic package 100 of the present disclosure may be produced in an automated batch process that is similar to the batch processes used in manufacturing integrated circuits. A large wafer containing many complete optoelectronic packages 100 is fabricated and then cut into individual modules. The planarity of the upper surface 120 of the insulating base 110 enables placement of the optoelectronic elements using a high-precision pick-and-place machine equipped with two-dimensional (2D) machine vision. Using such automated pick-and-place techniques, the number of active alignments may be reduced. In addition, such a package may be manufactured inexpensively and in an automated method.

In sum, the optoelectronic package 100 of the present disclosure is advantageous in that it may be easily assembled in a small footprint wafer-scale assembly that reduces manufacturing materials, and which may be mass-produced at low cost. In addition, the package 100 integrates conventional "TO-style" metal covers 150 with an insulating base 110 having a relatively high degree of thermal conductivity so that the integrated circuit 220 may be mounted closer to its associated optical device 200 within the package 100. As a result, multiple optoelectronic packages 100 may be manufactured cost-effectively, while offering the simultaneous advantages of high-speed electrical operation, adaptability to batch processing, hermeticity, effective heat sinking, and high mechanical stability.

In the foregoing description, the disclosed structures and manufacturing methods have been described with reference to exemplary embodiments. It will, however, be evident that various modifications and changes may be made thereto without departing from the broader spirit and scope of this disclosure. The above specification and figures accordingly are to be regarded as illustrative rather than restrictive. It is therefore intended that the present disclosure be unrestricted by the foregoing description and drawings, except as may appear in the following appended claims.

What is claimed is:

1. A package configured to house an optoelectronic assembly, the package comprising:

an insulating base having an upper surface;
an optoelectronic device attached directly to the upper surface of the insulating base;
a first metal member comprising a bottom wall and a top wall, the bottom wall of the first metal member being attached directly to the upper surface of the insulating base, the metal member being in electrical contact with an electrically conductive via within the insulating base; and
a metal cover having a rim located at a bottom portion thereof, the rim of the metal cover being configured to attach to the top wall of the first metal member to hermetically seal the metal cover to the insulating base.

2. The package of claim 1, wherein the insulating base is a multilayer base comprising metal layers located at a plurality of levels of the insulating base and electrically coupled together.

3. The package of claim 1, further comprising a heat dissipating device attached to the insulating base.

4. The package of claim 1, wherein the insulating base comprises a ceramic material.

5. The package of claim 1, wherein the insulating base has a polygonal shape.

6. The package of claim 1, wherein the metal cover has a transparent portion.

7. A method for providing a hermetic enclosure, the method comprising:
attaching an optoelectronic device directly to an upper surface of an insulating base;
attaching a bottom wall of a first metal member directly to the upper surface of the insulating base;
positioning a metal cover over the optoelectronic device, the metal cover comprising a rim at a bottom portion thereof;
attaching the rim of the metal cover to a top wall of the first metal member to hermetically enclose the optoelectronic device;
forming a plurality of holes that extends from the upper surface of the insulating base to a lower surface of the insulating base; and
filling the plurality of holes with a conductive material, where the first metal member is in electrical contact with the plurality of holes filled with conductive material.

8. The method of claim 7, further comprising:
attaching an integrated circuit adjacent to the optoelectronic device and directly to the upper surface of the insulating base, the integrated circuit being electrically coupled to the optoelectronic device;
positioning the metal cover over both the optoelectronic device and the integrated circuit located on the upper surface of the insulating base; and
attaching the rim of the metal cover to the top wall of the first metal hermetically enclose both the optoelectronic device and the integrated circuit.

9. The method of claim 8, wherein attaching the integrated circuit adjacent to the optoelectronic device and directly to the upper surface of the insulating base comprises attaching both the optoelectronic device and the integrated circuit within an inner region of the first metal member.

10. The method of claim 8, further comprising forming a first metal layer on the upper surface of the insulating base, the bottom wall of the first metal member being attached to the first metal layer disposed on the upper surface of the insulating base.

11. The method of claim 10, further comprising attaching the first metal member directly to the insulating base using an upper adhesive layer located between the bottom wall of the first metal member and the first metal layer disposed on the upper surface of the insulating base.

12. The method of claim 10, further comprising:
forming a second metal layer on the lower surface of the insulating base; and
patterning both the first and second metal layers into a plurality of conductive paths.

13. The method of claim 12, further comprising
attaching a second metal member to the second metal layer formed on the lower surface of the insulating base, the second metal member being in contact with each of the plurality of filled holes.

14. The method of claim 13, further comprising attaching the second metal member to the insulating base using a lower adhesive layer located between the second metal member and the second metal layer formed on the lower surface of the insulating base.

15. The method of claim 12, further comprising:
attaching at least one electrical lead to the second metal layer formed on the lower surface of the insulating base; and
communicating an electrical signal from at least one of the optoelectronic device and the integrated circuit housed inside the metal cover to a component located external to the metal cover using the at least one electrical lead.

16. A packaged optical module, comprising:
a base formed of an electrically insulating material and having at least a first surface and a second surface, for mounting an optical device being in direct contact to the base at the first surface, wherein the base has a plurality of electrically conductive vias;
a sealing member formed of an electrically conducting material and attached directly to the base, the sealing member extending along a perimeter of the base with the optical device being located within an inner region of the sealing member, the sealing member being in electrical contact with at least one of the plurality of electrically conductive vias;
a heat dissipating device attached to the second surface of the base; and
a cover formed of the electrically conducting material, the cover being configured to attach to the sealing member on the base to provide a hermetic enclosure for the optical device.

17. A package configured to house an optoelectronic assembly, the package comprising:
an insulating base having an upper surface and a lower surface, and having a plurality of electrically conductive vias extending from the upper to the lower surface;
an optoelectronic device attached to the upper surface of the insulating base and in electrical contact with at least one of the vias;
a metal member comprising a bottom wall and a top wall, the bottom wall of the metal member being attached directly to the upper surface of the insulating base and in electrical contact with at least one other of the vias; and
a metal cover having a rim located at a bottom portion thereof, the rim of the metal cover being configured to attach to the top wall of the metal member to hermetically seal the metal cover to the insulating base.

18. The package of claim 17, wherein the optoelectronic device is directly attached to the upper surface of the insulating base through an adhesive layer.

19. The package of claim 17, further comprising a heat dissipating device attached to the insulating base.

20. The package of claim 17, wherein the insulating base comprises a ceramic material.

21. The package of claim 17, wherein at least some of the plurality of vias are positioned for use in resistance welding of the package and wherein at least some of the plurality of vias are used to conduct electrical current during optoelectronic device operation.

* * * * *

UNITED STATES PATENT AND TRADEMARK OFFICE
CERTIFICATE OF CORRECTION

PATENT NO. : 7,255,496 B2  Page 1 of 1
APPLICATION NO. : 11/039174
DATED : August 14, 2007
INVENTOR(S) : Raghuram Narayan et al.

It is certified that error appears in the above-identified patent and that said Letters Patent is hereby corrected as shown below:

In the Claims:

At Column 11, line 54, "metal hermetically" should be -- metal member to hermetically --.

Signed and Sealed this

Twenty Second Day of April, 2008

JON W. DUDAS
*Director of the United States Patent and Trademark Office*